United States Patent
Hsu et al.

(10) Patent No.: US 7,095,781 B1
(45) Date of Patent: Aug. 22, 2006

(54) POLYPHASE FILTER WITH STACK SHIFT CAPABILITY

(75) Inventors: Hanna S-H. Hsu, Cerritos, CA (US); Maneesh Goyal, Hermosa Beach, CA (US); Jeffrey B. Warner, Hermosa Beach, CA (US); Ronald P. Smith, Redondo Beach, CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 0 days.

(21) Appl. No.: 09/448,175

(22) Filed: Nov. 24, 1999

(51) Int. Cl.
*H04B 17/00* (2006.01)
*H04B 3/46* (2006.01)
*H04Q 1/20* (2006.01)

(52) U.S. Cl. .................. 375/224; 375/340; 455/203; 455/303; 370/310

(58) Field of Classification Search ............. 375/224, 375/295, 346, 219, 240, 270, 321, 340; 455/203, 455/303; 370/210, 480
See application file for complete search history.

(56) References Cited

U.S. PATENT DOCUMENTS

| | | | |
|---|---|---|---|
| 4,107,470 A | 8/1978 | Maruta et al. | |
| 4,393,456 A | 7/1983 | Marshall et al. | |
| 4,792,943 A | 12/1988 | Gockler et al. | |
| 4,839,889 A | 6/1989 | Gockler et al. | |
| 5,436,940 A | 7/1995 | Nguyen et al. | |
| 5,606,575 A | 2/1997 | Williams et al. | |
| 5,937,010 A * | 8/1999 | Petranovich et al. | 375/295 |
| 6,085,077 A * | 7/2000 | Fields et al. | 455/303 |
| 6,493,358 B1 * | 12/2002 | Soleymani | 370/480 |

FOREIGN PATENT DOCUMENTS

EP 0668679 A2 * 8/1995

* cited by examiner

*Primary Examiner*—Jay K. Patel
*Assistant Examiner*—Curtis Odom
(74) *Attorney, Agent, or Firm*—Katten Muchin Rosenman LLP; John S. Paniaguas (57) ABSTRACT

A discrete Fourier transform (DFT) filter bank with stack shift capability, configured, for example, as an analyzer, but equally applicable to a synthesizer, and implemented as a polyphase filter. The DFT filter bank includes a complex modulator for multiplying the input signals $x_0(m)$, $x_1(m) \ldots x_{M-1}(m)$ by a complex modulator $e^{-2\pi k_o}(m)$. In order to keep the coefficients for the polyphase filter real, the coefficients are modulated by a DFT twiddle factor $e^{-2\pi k_o p/M}$. The use of the DFT twiddle factor enables the hardware to be reduced significantly. For example, for an 8 phase 203 tap filter, only 8 selectable negators are required as opposed to 211 for known DFT filter banks.

7 Claims, 5 Drawing Sheets

Prior Art

Sample Polyphase Filler Structure

Using compensation vector to perform LSB addition of two's complement negation $K_0 = 0$ Compensation Vector
$K_0 = 1/2$ Compensation Vector

Figure 7B

$K_0 = 0$ Comp Vect.
$K_0 = 0.5$ Comp Vect 1
$K_0 = 0.5$ Comp Vect 2

POLYPHASE FILTER WITH STACK SHIFT CAPABILITY

BACKGROUND OF THE INVENTION

1. Field of the Invention

The present invention relates to a discrete Fourier transform (DFT) filter bank, and more particularly to a polyphase filter bank with stack shift capability which can be implemented with significantly less hardware than known filter banks.

2. Description of the Prior Art

Digital filter banks are generally known in the art. Examples of such digital filter banks are disclosed in U.S. Pat. Nos. 4,107,470; 4,393,456; 4,792,943; 4,839,889; 5,436,940; and 5,606,575, hereby incorporated by reference. Such digital filter banks are implemented with digital signal processors and are used in a wide variety of applications including telecommunications applications, for example, cellular telephone applications.

Figure 1A:
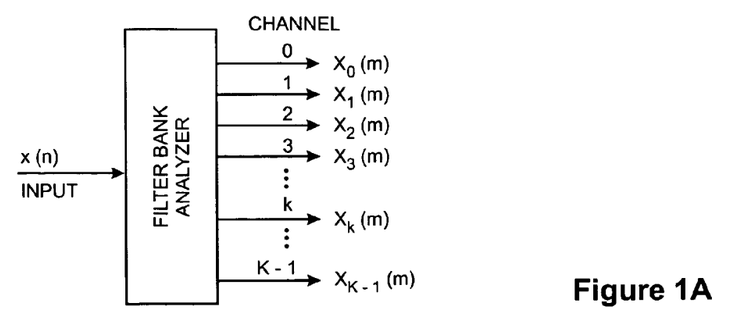
FIG. 1A is a generalized block diagram for a K channel filter bank analyzer.
Figure 1B:
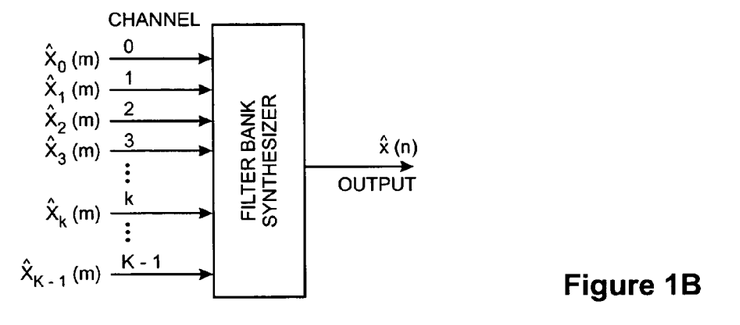
FIG. 1B is similar to FIG. 1a but for a K channel filter bank synthesizer.

Such digital filter banks are known to be used as spectrum analyzers as illustrated in FIG. 1A and frequency synthesizers, as illustrated in FIG. 1B as discussed in detail in *Multi-Rate Digital Signal Processing*, by Ronald E. Crochiere and Lawrence R. Rabiner, Prentice Hall, copyright 1983, hereby incorporated by reference. As is generally known in the art, the principles relating to frequency synthesizers are normally applicable to spectrum analyzers and vice versa.

Referring to FIG. 1A, a broad-band input signal x(n) is applied to a digital filter bank, configured as a spectrum analyzer, which divides the input signal x(n) into K frequency channels, 0 through K−1, which correspond to K output signals $x_0(m), x_1(m) \ldots x_k(m) \ldots x_{K-1}(m)$.

Similarly, the system illustrated in FIG. 1B may be used to synthesize a plurality of input signals $x_0(m), x_1(m) \ldots x_k(m) \ldots x_{K-1}(m)$, defining K input channels, 0 through K−1. In this embodiment, K input signals $x_0(m), x_1(m) \ldots x_{K-1}(m)$ representing K channels 0 through K−1 are synthesized by the digital filter bank to form a broad-band output signal x(n).

Figure 2A:
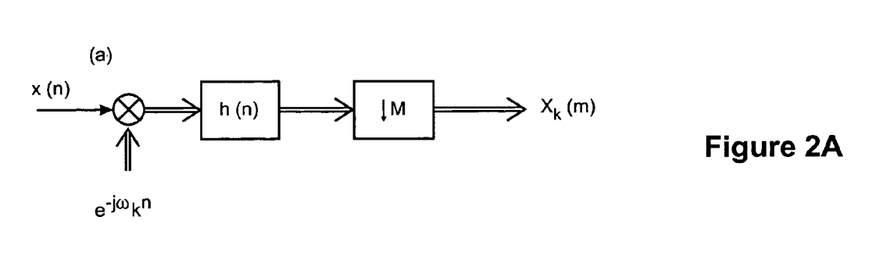
FIGS. 2A and 2B are block diagrams showing additional details of the DFT filter bank analyzer and synthesizer illustrated in FIGS. 1a and 1b.
Figure 2B:
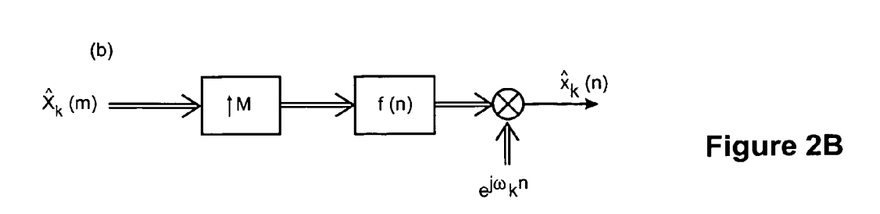

FIGS. 2A and 2B represent models for a DFT filter bank analyzer and a DFT filter bank synthesizer, respectively, as set forth in *Multi-Rate Digital Signal Processing*, supra. For simplicity, only a single channel is illustrated. As illustrated in FIGS. 2A and 2B, the sampling frequency of the analyzer is decimated or decreased while the sampling frequency for the synthesizer is interpolated or increased. As such, such DFT digital filter banks are multi-rate in nature.

As shown in FIGS. 2A and 2B, the DFT filter banks are modeled by a low pass filter h(n), f(n) and a complex modulator. In addition, as discussed above, the sampling frequency is either decimated by a factor M as in the case of a filter bank analyzer or interpolated by a factor M in the case of a filter bank synthesizer. As shown in FIG. 2A, in the case of the analyzer, an input signal x(n) is modulated by a complex modulator of the form $e^{-j\omega_k n}$ and low pass filtered by a filter h(n). The sampling rate is then reduced or decimated by a factor M to generate the channel signals $x_k(m)$. The filter h(n) determines the width and the frequency response of each of the channels. The filters h(n) for each channel are identical.

For a DFT filter bank with uniformly spaced filters and even type stacking arrangements, the center frequency of each of the channels is given by equation 1 below:

$$\omega_k = \frac{2\pi k}{K}, k = 0, 1, \ldots, K-1 \quad (1)$$

By defining $W_K = e^{j(2\pi/K)}$ the complex modulation function can be rewritten as shown in equation 2 below:

$$e^{-j\omega_k n} = e^{-j2\pi k n/K} = W_K^{-kn} \quad (2)$$

The channel signals may then be expressed as set forth in equation 3:

$$X_K(m) = \sum_{n=-\infty}^{\infty} h(mM-n)x(n)W_K^{-kn}, k = 0, 1, \ldots, K-1 \quad (3)$$

With respect to the DFT filter bank synthesizer, for example as shown in FIG. 2B, all of the input channel signals $x_0(m), x_1(m) \ldots x_k(m) \ldots x_{K-1}(m)$ are interpolated to a higher sampling rate and modulated back to the original spectral location. The synthesizer then adds all of the channel signals together to produce a single output signal x(n). Each of the input channel signals $x_0(m), x_1(m) \ldots x_k(m) \ldots x_{K-1}(m)$ are interpolated by a factor M and filtered with an interpolation filter f(n) and modulated by a complex modulation function $W_K^{-kn} = e^{-j\omega_k n}$ to shift the channel signal back to its original location $\omega_k$. Equation 4 represents the output of each channel signal:

$$\hat{x}_k(n) = W_K^{kn} \sum_{m=-\infty}^{\infty} \hat{X}_k(m)f(n-mM), k = 0, 1, \ldots, K-1 \quad (4)$$

Since the synthesizer output signal is the sum of all of the channel signals as shown in Equation 5, Equation 4 can be rewritten as shown in Equation 6:

$$\hat{x}(n) = \frac{1}{k}\sum_{k=0}^{k-1} \hat{x}_k(n) \quad (5)$$

$$\hat{x}(n) = \sum_{n=-\infty}^{\infty} f(n-mM)\frac{1}{K}\sum_{k=0}^{K-1} \hat{X}_k(m)W_K^{kn} \quad (6)$$

Figure 3A:
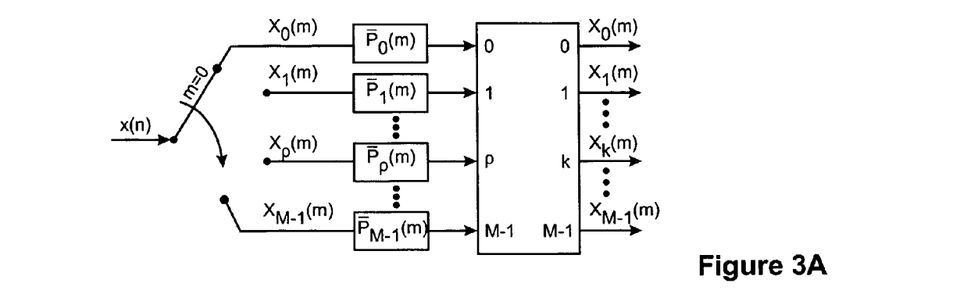
FIGS. 3A and 3B illustrate commutator models of a DFT filter bank analyzer and synthesizer implemented as polyphase filter networks.
Figure 3B:
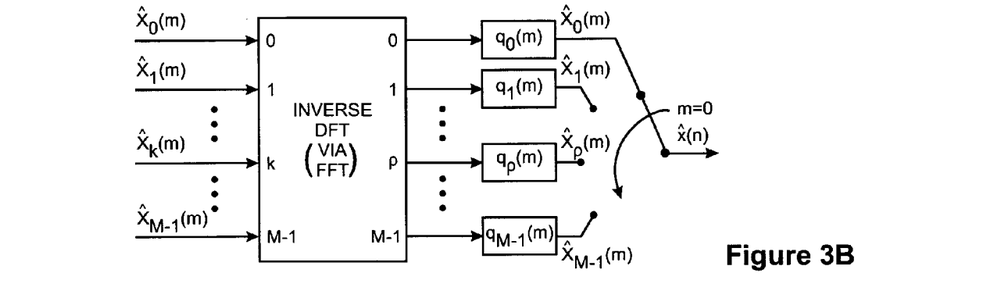
Figure 4:
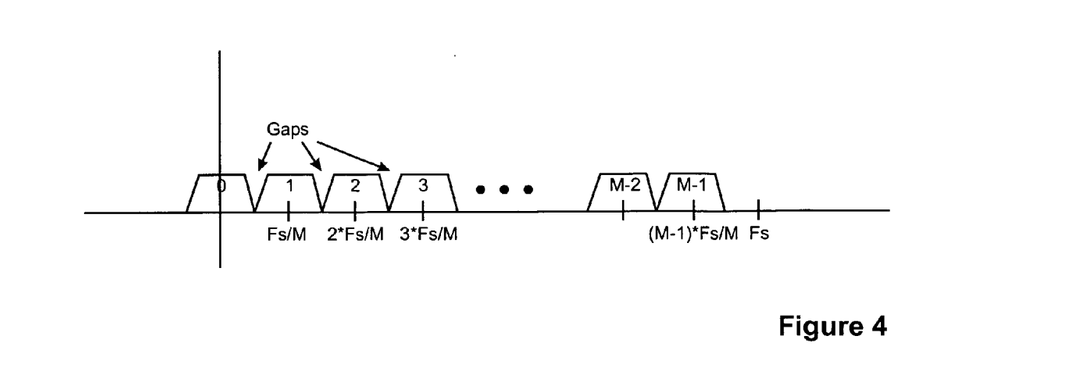
FIG. 4 is a graphical illustration of the frequency response of a known DFT filter bank analyzer or synthesizer.

In order to improve the efficiency of such DFT filter banks, such DFT filter banks are known to be implemented as polyphase filters. More particularly, the decimator M and low pass filter h(n) implementation of the frequency analyzer and the interpolator M and filter f(n) of the frequency synthesizer are replaced with polyphase filter structures $p_\rho$ (m) as illustrated in FIGS. 3A and 3B, respectively. As mentioned above, both the analyzer and the synthesizer are multirate devices. The complex modulation as well as the polyphase filters $P_\rho$ essentially shift the frequency of the prototype filters (h(n) or f(n)), for example as shown in FIG.

Figure 5A:
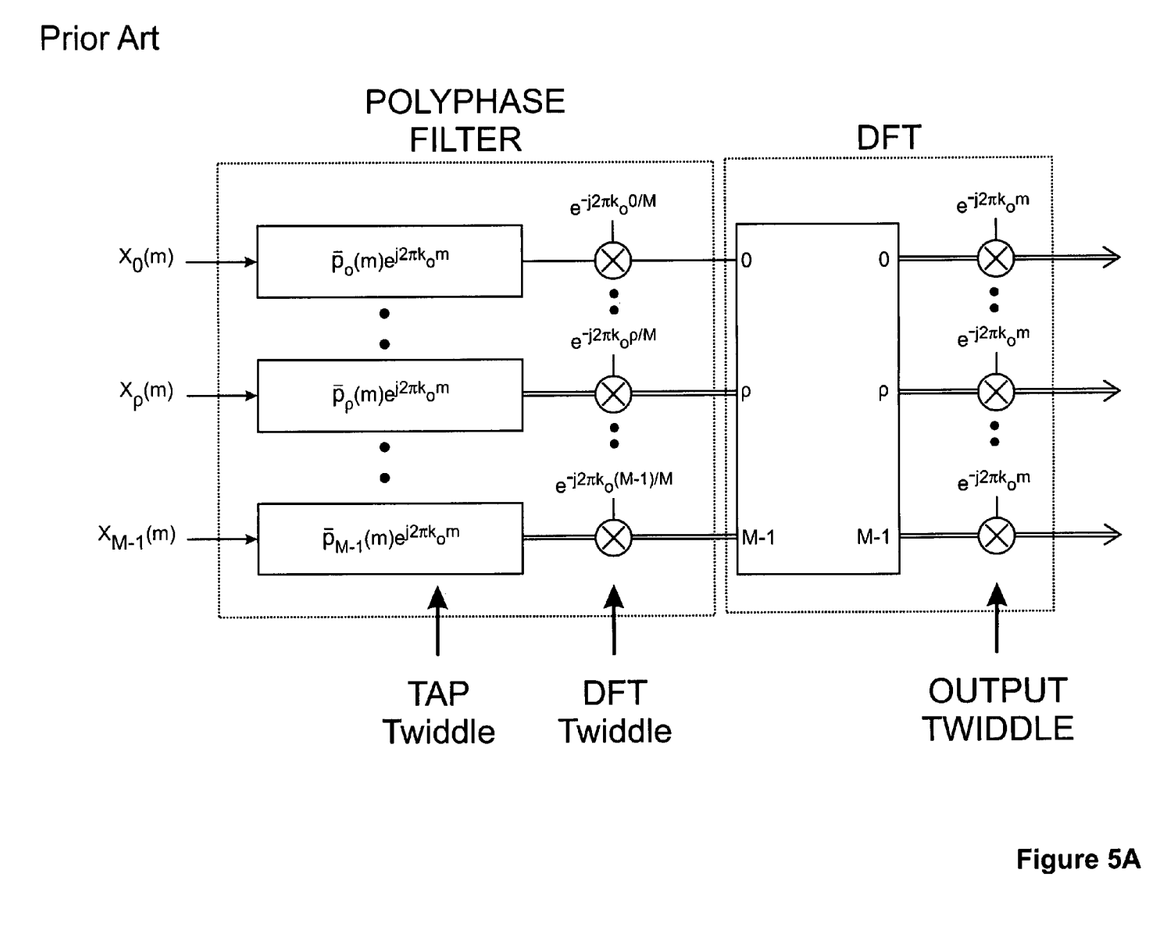
FIG. 5A is a block diagram of a conventional DFT polyphase filter bank analyzer.

4. As shown, the center frequency of each of the M frequency channels is a multiple of the sampling frequency $F_s$, divided by the number of channels. As shown in FIG. 4, the transition bands of the low pass filter get shifted and become gaps in the frequency response of a DFT filter bank. In order to resolve this problem of gaps in the frequency response, DFT filter banks are utilized with stack shift capability. An example of such a DFT filter bank is illustrated in FIG. 5A, a polyphase filter bank with M channels, each channel including the following twiddle factors: tap twiddle, DFT twiddle and output twiddle, as discussed in detail Multi-Rate Digital Signal Processing, supra. Each tap twiddle factor includes a complex term in the form $e^{j2\pi k_o m}$, wherein $k_o$ is the stack shift factor. The tap twiddle is used to provide the stack shift. Unfortunately, such a DFT filter bank with tap twiddle requires an inordinate amount of hardware to implement. For example, to implement an 8 phase 203 tap filter as illustrated in FIG. 5A, 211 selectable negators are required to produce even/odd stack shifts. Unfortunately, this amount of hardware duly complicates the system and raises the cost. Thus, there is a need for a more hardware efficient implementation of a digital filter bank with stack shift capability.

SUMMARY OF THE INVENTION

Briefly, the present invention relates to a discrete Fourier transform (DFT) filter bank with stack shift capability, configured, for example, as an analyzer, but equally applicable to a synthesizer, and implemented as a polyphase filter. The DFT filter bank includes a complex modulator for multiplying the input signals $x_0(m), x_1(m) \ldots x_{M-1}(m)$ by a complex modulator $e^{-j2\pi k_o}(m)$. In order to keep the coefficients for the polyphase filter real, the coefficients are modulated by a DFT twiddle factor $e^{-j2\pi k_o p/M}$. The use of the DFT twiddle factor enables the hardware to be reduced significantly. For example, for an 8 phase 203 tap filter, only 8 selectable negators are required as opposed to 211 for known DFT filter banks.

DESCRIPTION OF THE DRAWINGS

These and other advantages of the present invention will be readily understood with reference to the following specification and attached drawing wherein.

DETAILED DESCRIPTION

The present invention relates to a polyphase DFT filter bank with stack shift capability. Although the principles of the invention are described and illustrated herein with respect to a frequency analyzer, as is generally known in the art, such principles are also applicable to DFT filter banks implemented as frequency synthesizers. All such embodiments are intended to be covered by the scope of the appended claims.

As mentioned above, the DFT filter in accordance with the present invention is adapted to significantly reduce the hardware for implementing DFT filter banks implemented as polyphase filter networks with even/odd stack shift capability. As discussed above, for an 8 phase 203 tap filter, known filter banks require 211 selectable negators while only 8 are required for the present invention.

Figure 5B:
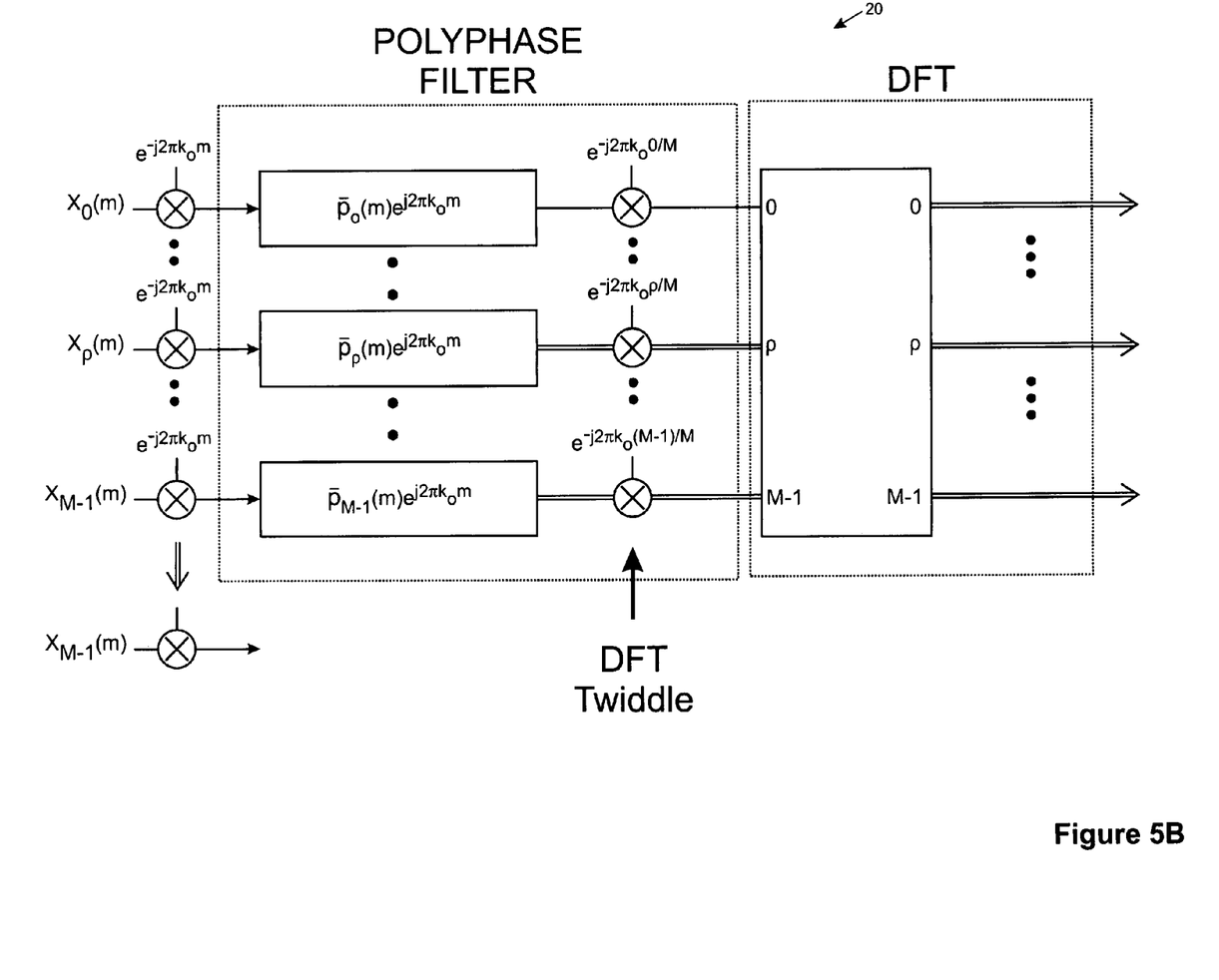
FIG. 5B is a block diagram of a DFT polyphase filter bank analyzer in accordance with the present invention.

As discussed in *Multi-Rate Digital Signal Processing*, supra, a stack shift may be implemented by shifting the filter response in mathematical terms. More particularly, as illustrated in FIGS. 5A and 5B, the DFT filter bank analyzer includes M polyphase filters $p_0(m) \ldots p_\rho(m) \ldots p_{M-1}(m)$. In order to accomplish the odd/even stack shift, the filter response of each of the polyphase filters $p_0(m) \ldots p_\rho(m) \ldots p_{M-1}(m)$ is multiplied by a term $W_M^{k_o mM} = e^{+j2\pi k_o m}$ resulting in all of the polyphase filters $P_0(m) \ldots P_\rho(m) \ldots P_{M-1}(m)$ becoming generally complex filters. In addition, the output of each of the polyphase filters is modulated by a factor $e^{-j\pi k_o \rho/M}$, where $k_0 = 0$ or 0.5. The output sum is multiplied by $e^{-j2\pi k_o m}$, or $(-1)^m$. With such a configuration, the following additional hardware is required to implement the even/odd stack shift: selectable negation for all filter taps; selectable negation for the output signal; and selectable DFT twiddle factors.

With such an implementation, the output signal is given by equation 7 below:

$$x_\rho(m) = x(mM + \rho), \rho = 0, 1, \ldots, M - \quad (7)$$
$$P_\rho(m) = h(mM - \rho), \rho = 0, 1, \ldots, M -$$
$$Y_k(m) = e^{-j2\pi k_0 \cdot m} \sum_{\rho=0}^{M-1} e^{-j2\pi/M \cdot k \cdot \rho} \cdot$$
$$e^{-j2\pi k_0 \cdot \rho}[x_\rho(m) * (P_\rho(m) e^{-j2\pi k_0 \cdot m})]$$

where m is the time index, $\rho$ is the input/polyphase filter branch (from 0 to M−1), k is the kth channel of channelizer (from 0 to M−1), $k_0$ denotes the channelizer stacking mechanism (0 for even stacking, 0.5 for odd stacking), and M is the total number of branches/channels. $x_\rho(m)$ are the M input branches, $e^{j2\pi k_o m}$ is the filter tap modifying factor, $P_\rho(m)$ are the 8 polyphase filter branches, $e^{j2\pi/M k_o \rho}$ is the DFT twiddle factor, and $$\sum_{\rho=0}^{M-1} e^{-j2\pi/M k \rho}$$

denotes the DFT operation.

In order to reduce the amount of hardware needed to implement the filter taps, the DFT filter bank in accordance with the presenting invention eliminates the need to selectively negate all filter taps and the output signal and instead selectively negates the input signal only, thus significantly reducing the amount of hardware required to implement the filter bank. Referring to FIG. 5B, the DFT filter bank analyzer in accordance with the present invention is illustrated and identified with the reference numeral 20. As shown, the DFT filter bank 20 is adapted to analyze input signals $x_o(m) \ldots x_1(m) \ldots x_{M-1}(m)$, which are polyphase compononets of $X(n)$, and provide an output signal. Generally, in order to shift the input frequencies by $\omega$, the input signals $x_o(m) \ldots x_1(m) \ldots x_{M-1}(m)$ are multiplied by a factor $e^{-j\omega n}$, where n is a time index of the input signal. This operation results in a generally complex signal, which, in turn, requires a complex filter to process and thus doubles the size of the filter.

The filters are implemented as polyphase filters $p_0(m) \ldots p_\rho(m) \ldots p_{M-1}(m)$. Rather than modify the frequency response of each of the filters in the polyphase filter bank as is known, the present invention shifts the frequency of the M input signals $x_0(m) \ldots x_n(m) \ldots x_{M-1}(m)$, by $\omega$ where $\omega=\pi/M$ and M equals the total number of channels. The multiplication factors preceding each branch or channel of the polyphase filter bank take on the following form:

| Branch No. | First M Input Samples | Second M Input Samples | Third M Input Samples |
|---|---|---|---|
| 0 | $e^{j(\pi/M)*0}$ | $e^{j(\pi/M)*M}$ | $e^{j(\pi/M)*(2M)} = e^{j(\pi/M)*0}$ |
| 1 | $e^{j(\pi/M)*1}$ | $e^{j(\pi/m)*(M+1)} = -e^{j(\pi/M)*1}$ | $e^{j(\pi/M)*(2M+1)} = e^{j(\pi/m)*1}$ |
| ... | ... | ... | ... |
| M−2 | $e^{j(\pi/M)*(M-2)}$ | $e^{j(\pi/M)*(2M-2)} = -e^{j(\pi/M)*(M-2)}$ | $e^{j(\pi/M)*(3M-2)} = e^{j(\pi/M)*(M-2)}$ |
| M−1 | $e^{j(\pi/M)*(M-1)}$ | $e^{j(\pi/M)*(2M-1)} = -e^{j(\pi/M)*(M-1)}$ | $e^{j(\pi/M)*(3M-1)} = e^{j(\pi/M)*(M-1)}$ |

The fourth M input samples have multiplicative factors identical to those of the second M input samples and so on. As can be observed above, the multiplicative factors for a particular branch have a repetitive pattern where every other one has the same value and adjacent factors are negatives of each other. As such, these multiplicative factors may be implemented with relatively simple hardware by the input twiddle and DFT twiddle circuit illustrated in FIG. 5B.

Figure 6:
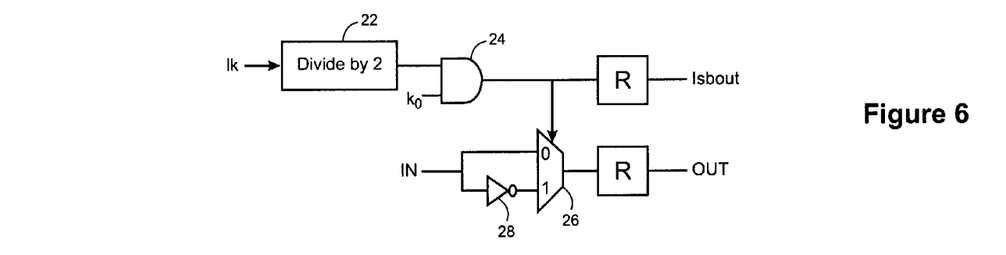
FIG. 6 is a block diagram of an input twiddle block in accordance with the present invention.

FIG. 6 is a block diagram of the input twiddle circuit. The input twiddle circuit provides a ±1 factor for the multiplicative factors as discussed above. In particular, the input twiddle circuit may be implemented as a selectable alternating inverter. The input twiddle circuit includes a divide by two counter which essentially divides a clock input by two. The output of the divide by two counter 22 is ANDed with a stack shift factor $k_0$ by way of an AND gate 24, used to generate the least significant bit output 1 sbout. The output of the AND gate 24 also drives a multiplexer 26 in which the input signal $x_0(m) \ldots x_p(m) \ldots x_{M-1}(m) \ldots$ and its complement are applied by way of an inverter 28 to multiplexer 26. The output of the multiplexer 26 is an output signal OUT that is applied to the input polyphase filters $P_0 \ldots P_{M-1}$.

In FIG. 6, $k_0$ is set to logic 0 when the filter is to be configured as an even-stack filter ($k_0=0$ in equations above). It is set to logic 1 when the filter is to be configured as an odd-stack filter ($k_0=0.5$ in equations above). Thus when the filter is configured as an even-stack filter, the ouput of the AND gate 24 is always logic 0 in which case the MUX 26 selects the IN signal. In other words, the IN signal passes through the circuit unaltered. When the filter is configured as an odd-stack filter, the output of the AND gate 24 is the same as the ouput of the clock divide block 22 (since $k_0$ is logic 1), which is alternating high and low. In this configuration, the MUX 26 ouputs the signals IN and IN inverted (output of the INV 28) on alternating clock cycles, effectively negating the input on every other clock cycle.

Negation in two's complement of a number is accomplished by inverting all bits and adding 1 to the LSB. Referring to FIG. 6, if the 1 sbout and OUT signals are added together, then input negation on alternating clock cycles is complete. However, the addition of the 1 sbout and OUT signals needs to be propagated all the way up to the MSB of the sum; potentially a slow operation. In order to avoid this operation, compensation vectors are used. Such compensation vectors are known in prior art, for example as disclosed in, "A Silicon Complier for High-Speed CMOS Multirate FIR Digital Filters," Robert Hawley M. S. thesis, University of California, Los Angeles, 1991, hereby incorporated by reference. With the LSB addition incorporated into the compensation vectors, only an inverter is needed to implement the input twiddle circuit. This eliminates the need to do a true two's complement negation and the carry propagation associated with it, allowing high speed operation of the filter without additional pipelining.

As mentioned above, the input twiddle circuit provides an alternating 0 and 1 output at the 1 sbout output. This least significant bit 1 sbout signal is applied to the polyphase filters $P_p$ to complete the two's complement negation through the use of compensation factors as discussed below.

Figure 7A:
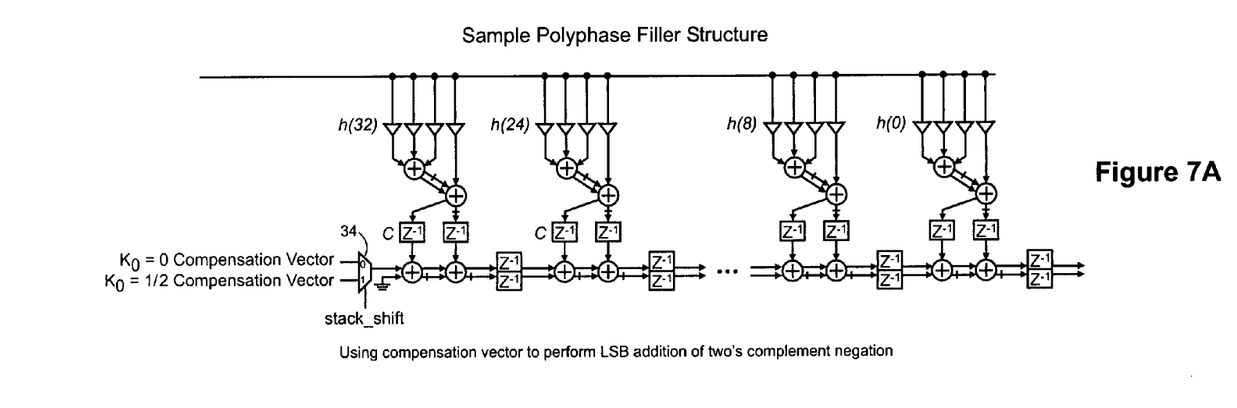
FIG. 7A is a block diagram of a polyphase filter structure for use in accordance with the present invention.

FIG. 7 illustrates one branch of a polyphase filter implemented in CSD coefficients, for example, as disclosed in the Hawley reference, supra. Normally, only one compensation vector is required per filter branch. However, in order to implement a stack shift, one compensation vector is required for an even stack ($k_0=0$) and two additional compensation vectors are required for an odd stack ($k_0=0.5$). The compensation vector for the even stack configuration can be derived using the method described in Hawley, supra. The compensation vectors for the odd stack configuration can be derived similarly, with modified terms for LSB addition due to 2's complement negation of CSD coefficients.

As disclosed in the Hawley reference, supra, an LSB addition term is added to the compensation vector when a CSD coefficient of a filter tap is negative. To illustrate, let C be a positive number and X be the input signal. An LSB term is added to the compensation vector if a CSD coefficient is negative (−C*X). No additional term is required in the compensation vector when a CSD coefficient is positive (C*X). But since −C*(−X)=C*X and C*(−X)=−C*X, when the input signal is negated (−X) by the input twiddle, an LSB term is required in the compensation vector if a CSD coefficient is positive (C*(-X)=-C*X), while no additional term is required if a CSD coefficient is negative (-C*(-X)=C*X).

Figure 7B:
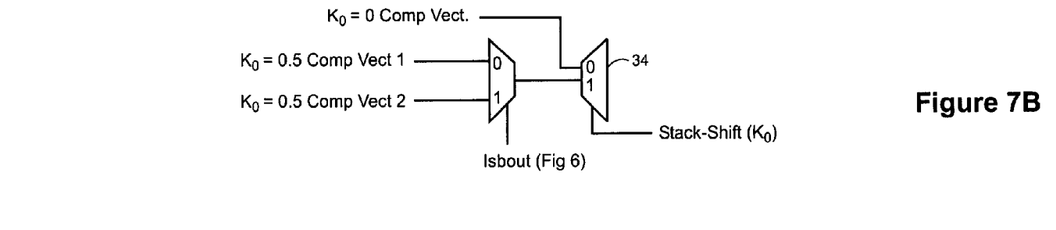
FIG. 7B is a block diagram illustrating the use of multiple compensation vectors for use with the polyphase filter illustrated in FIG. 7A.

For an odd stack shift ($k_0$=0.5) the inputs $x_0$, $x_1$, $x_2$, $x_3$ ... become $x_0$, $-x_1$, $x_2$, $-x_3$ ..., the filter outputs for a single phase in terms of the taps $h_0$, $h_1$, $h_2$, $h_3$ ... become $y_0=h_0{}^*x_0$, $y_1=h_0{}^*(-x_1)+h_1{}^*(x_0)$; $y_2=h_0{}^*(x_2)+h_1{}^*(-x_1)+h_2{}^*(x_2)$; $y_3=h_0{}^*(-x_3)+h_1(x_2)+h_1{}^*(-x_1)+h_3{}^*x_0$. These filter outputs are completed by two compensation vectors identified in FIG. 7, for example, as comp vector 1, comp vector 2. The first compensation vector comp 1 vector is used to add an LSB to negative CSD bits of even taps ($h_0$, $h_2$, $h_4$ ...) and positive CSD bits and odd taps ($h_1$, $h_3$, $h_5$ ...) and is applicable for outputs $y_0$, $y_2$ ... $y_{2n}$. The second compensation vector comp 2 vector is used to add LSB to negative CSD bits of odd taps and positive CSD bits of even taps for outputs $y_1$, $y_3$ ... $y_{2n+1}$.

These different comp vectors, comp vector 1, comp vector 2, are applied to a MUX 32 which, in turn, is under the control of the signal 1 sbout (FIG. 6). The MUX 32 is applied to one input of a MUX 34. The MUX 34 is used for even/odd stack shift. In particular, for even stack shift, an even stack compensation vector is applied to the polyphase filter structure. During conditions of an odd stack shift, one of the odd stack shift compensation vectors, comp vector 1, or comp vector 2 is applied to the MUX 34 under the control of the signal 1 sbout. As mentioned above for an odd stack shift, the signal 1 sbout alternates between 0 and 1 logic states, thus providing the proper compensation factor for the particular sample period.

In order to maintain the coefficients for the polyphase prototype filter real, the complex portion of the multiplicative factors is implemented at the end of each branch, shown as DFT twiddle factors $e^{-j2\pi k_o \rho/M}$. The filter bank 20 in accordance with the present invention using the stack shift scheme discussed above is thus described by equation (8) below:

$$Y_k(m) = \sum_{p=0}^{M-1} e^{-j2\pi k\rho/M} \cdot e^{-j2\pi k_0 \rho/M} [X_\rho(m) \cdot e^{-j2\pi k_0 m} * P_\rho(m)], \quad (8)$$

$$k = 0, 1, \ldots, kM-1$$

$$x_\rho(m) = x(Mm - \rho), \rho = 0, 1, \ldots, M-1$$

$$\overline{P}_\rho(m) = h(Mm + \rho), \rho = 0, 1, \ldots, M-1$$

where m is the time index, ρ is the input/polyphase filter branch (from 0 to M-1), k is the kth channel of channelizer (from 0 to M-1), $k_0$ denotes the channelizer stacking mechanism (0 for even stacking, 0.5 for odd stacking), and M is the total number of branches/channels. $X_\rho(m)$ are the M input branches, $e^{-j2\pi k_o m}$ is the input twiddle factor, $\overline{P}_\rho(m)$ are the 8 polyphase filter branches $e^{-j2\pi/Mk_o \rho}$ is the DFT twiddle factor, the DFT operation is denoted by equation (9).

$$\sum_{p=0}^{M-1} e^{j2\pi \cdot k \cdot p/M} \quad (9)$$

(9)

Obviously, many modifications and variations of the present invention are possible in light of the above teachings. Thus, it is to be understood that, within the scope of the appended claims, the invention may be practiced otherwise than as specifically described above.

What is claimed is:

1. A frequency analyzer for analyzing a plurality of input signals $x_0(m) \ldots x_1(m) \ldots x_{M-1}(m)$, the frequency analyzer comprising:
a plurality of input modulators for modulating and shifting said input signals $x_o(m) \ldots x_1(m) \ldots x_{M-1}(m)$, defining shifted output signals, wherein said plurality of input modulators include a multiplier for multiplying each of said input signals $x_o(m) \ldots x_1(m) \ldots x_{M-1}(m)$ by a factor $e^{-j\omega n}$, where n is a time index;
a polyphase filter network which includes a plurality of polyphase filters $p_o(m) \ldots p_\rho(m) \ldots p_{M-1}(m)$, each having a coefficient for receiving said shifted output signals and defining polyphase filter output signals; and
a plurality of output modulators for modulating the output of said polyphase filters, said frequency analyzer configured to process said plurality of input signals $x_o(m) \ldots x_1(m) \ldots x_{M-1}(m)$, wherein each of said plurality of polyphase filters includes a network coefficient and said output modulators include a multiplier for multiplying the output of each of said polyphase filters by a predetermined factor selected so that said coefficients are real.

2. The frequency analyzer as recited in claim 1, wherein said output modulator includes means for multiplying said filter output signals by a factor $e^{-j2\pi k_0 p/M}$, where $k_0$ is a suitable odd/even stacking factor p is the channel, and M is total number of channels.

3. A polyphase filter comprising:
a plurality of filter channels, $$\overline{p}_0(m) \ldots \overline{p}_p(m) \ldots \overline{p}_{M-1}(m)$$

for filtering a plurality of input signals $x_0(m) \ldots x_p(m) \ldots x_{M-1}(m)$, and
a plurality of output modulators for modulating each of the outputs of said plurality filter channels by a modulation factor, wherein each of said input signals are modulated by a complex modulator which modulates each input signal $x_0(m) \ldots x_p(m) \ldots x_{M-1}(m)$ by a factor $(-1)^m$, where m is the time index and wherein each of said plurality of filter channels includes a coefficient and said output modulators include a multiplier for multiplying the output of each of said filter channels by a factor selected so that said coefficients are real.

4. The polyphase filter as recited in claim 3, wherein said complex modulation factor is $e^{-j2\pi k_o pM}$, where $k_o$ is a selectable odd/even stacking factor, p is the channel and M is the number of channels.

5. The frequency analyzer as recited in claim 1, wherein said input modulators include an inverter and one more multiplexers for receiving one or more compensation vectors for selectively negating said input signals.

6. A frequency synthesizer for analyzing a plurality of input signals $x_o(m) \ldots x_1(m) \ldots x_{M-1}(m)$, the frequency analyzer comprising:
a plurality of input modulators for modulating and shifting said input signals $x_o(m) \ldots x_1(m) \ldots x_{M-1}(m)$, defining shifted output signals;
a polyphase filter network which includes a plurality of polyphase filters $p_o(m) \ldots p_\rho(m) \ldots p_{M-1}(m)$, each having a coefficient for receiving said shifted output signals and defining polyphase filter output signals; and
a plurality of output modulators for modulating the output of said polyphase filters, said frequency synthesizer configured to combine said polyphase filter output signals and provide a single output signal, said output modulators include a multiplier for multiplying the output of each of said plurality of polyphase filters $p_o(m) \ldots p_\rho(m) \ldots p_{M-1}(m)$ by a predetermined factor selected so that said coefficients are real.

7. The frequency synthesizer as recited in claim 6, wherein said input modulations include an inverter and one more multiplexers for receiving one or more compensation vectors for selectively negating said input signals.

* * * * *